(12) United States Patent
Loh et al.

(10) Patent No.: US 7,253,606 B2
(45) Date of Patent: Aug. 7, 2007

(54) FRAMEWORK THAT MAXIMIZES THE USAGE OF TESTHEAD RESOURCES IN IN-CIRCUIT TEST SYSTEM

(75) Inventors: Aik Koon Loh, Singapore (SG); Roy Williams, Fort Collins, CO (US); Keen Fung Jason Wai, Singapore (SG); Chen Ni Low, Singapore (SG); Yi Jin, Singapore (SG); Rex Shang, Fort Collins, CO (US); Tiam Hock Joseph Tan, Singapore (SG); Daniel Z Whang, Singapore (SG)

(73) Assignee: Agilent Technologies, Inc., Santa Clara, CA (US)

( * ) Notice: Subject to any disclaimer, the term of this patent is extended or adjusted under 35 U.S.C. 154(b) by 115 days.

(21) Appl. No.: 11/183,342

(22) Filed: Jul. 18, 2005

(65) Prior Publication Data

US 2007/0013362 A1     Jan. 18, 2007

(51) Int. Cl.
*G01R 31/28* (2006.01)

(52) U.S. Cl. .................................. 324/158.1; 324/765

(58) Field of Classification Search .................. None
See application file for complete search history.

(56) References Cited

U.S. PATENT DOCUMENTS

| | | | |
|---|---|---|---|
| 4,736,318 A * | 4/1988 | Delyani et al. | 718/103 |
| 6,747,469 B2 * | 6/2004 | Rutten | 324/765 |
| 7,047,463 B1 * | 5/2006 | Organ et al. | 714/724 |
| 2004/0100982 A1 * | 5/2004 | Balasubramanian | 370/429 |
| 2005/0132256 A1 * | 6/2005 | Watanabe et al. | 714/42 |

* cited by examiner

*Primary Examiner*—Ha Tran Nguyen
*Assistant Examiner*—Richard Isla-Rodas

(57) ABSTRACT

A method and apparatus for maximizing the usage of a testhead of an in-circuit tester is presented. A testhead execution supervisor interfaces between a testhead controller and a graphical user interface used to enter manual tests. The testhead execution supervisor adds tests to be submitted to the testhead to one or more queues according to a priority scheme. Tests may be submitted to the testhead execution supervisor both as manual tests entered via the graphical user interface and as automatically generated tests generated by an automatic debug module. The automatic debug module may automatically generate tests for execution by the testhead that are executed when the testhead is idle, for example when no higher priority manual tests are scheduled.

5 Claims, 7 Drawing Sheets

FRAMEWORK THAT MAXIMIZES THE USAGE OF TESTHEAD RESOURCES IN IN-CIRCUIT TEST SYSTEM

BACKGROUND OF THE INVENTION

The increasing reliance upon computer systems to collect, process, and analyze data has led to the continuous improvement of the system assembly process and associated hardware. With the improvements in speed and density of integrated circuits, the cost and complexities of designing and testing these integrated circuits has dramatically increased. Currently, large complex industrial integrated circuit testers (commonly referred to in the industry as "Automated Test Equipment" or "ATE") perform complex testing of integrated circuit devices, such as integrated circuits, printed circuit boards (PCBs), multi-chip modules (MCMs), System-on-Chip (SOC) devices, printed circuit assemblies (PCAs), etc. The tests that must be performed may include, among others, in-circuit test (ICT), functional test, and structural test, and are designed to verify proper structural, operational, and functional performance of the device under test (DUT).

An example of an automated test is the performance of an in-circuit test. In-circuit testing, which verifies the proper electrical connections of the components on the printed circuit board (PCB), is typically performed using a bed-of-nails fixture or robotic flying-prober (a set of probes that may be programmably moved). The bed-of-nails fixture/robotic flying-prober probes nodes of the device under test, applies a set of stimuli, and receives measurement responses. An analyzer processes the measurement responses to determine whether the test passed or failed.

A typical in-circuit test will cover many thousands of devices, including resistors, capacitors, diodes, transistors, inductors, etc. Tests are typically passed to the tester via some type of user interface. Typically, a graphical user interface is provided to allow an engineer or test technician to manually enter tests or, in testers that provide test generation capability, to enter various configurations and parameters for each type of device and to instruct the tester to automatically generate tests for devices of that type. However, in order to execute any test, whether entered manually or generated automatically by tester software, current software requires manual intervention to schedule the execution of tests.

Often, significant time is spent in setting up, configuring, and debugging a given test to be executed by the tester. During this time, the tester sits idle. More particularly, a typical technique for debugging in-circuit tests is by sending interactive tests to the testhead using a trial and error approach. Regardless of the experience of the test engineer and conditions under which the engineer is working, which can vary widely and therefore result in differing solution times, this approach does not fully maximize usage of the in-circuit testhead.

In addition, upon completion of any given test, unless additional tests have been scheduled, the testhead is also left idle. During debug operations, the execution of a next test depends greatly on the technician's decision to formulate the next trial combination. Time taken for this to happen includes navigation of test information, cross-referencing of test information and attributes, and the test engineer's thought process in determining what avenue of approach to try next in the test process. Accordingly, a contribution in the art would be a technique for maximizing the utilization of the testhead. Another contribution in the art would be to have the tester automatically generate and execute tests for a device under test during idle time of the testhead.

SUMMARY OF THE INVENTION

The present invention is a method and apparatus for maximizing the usage of a testhead of an in-circuit tester in a manufacturing environment. A testhead execution supervisor interfaces between a testhead controller and a graphical user interface used to enter manual tests. The testhead execution supervisor adds tests to be submitted to the testhead to one or more queues according to a priority scheme. Tests may be submitted to the testhead execution supervisor both as manual tests entered via a graphical user interface and as automatically generated tests generated by an automatic debug module. The automatic debug module may automatically generate tests for execution by the testhead that are executed when the testhead is idle, for example when no higher priority manual tests are scheduled.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
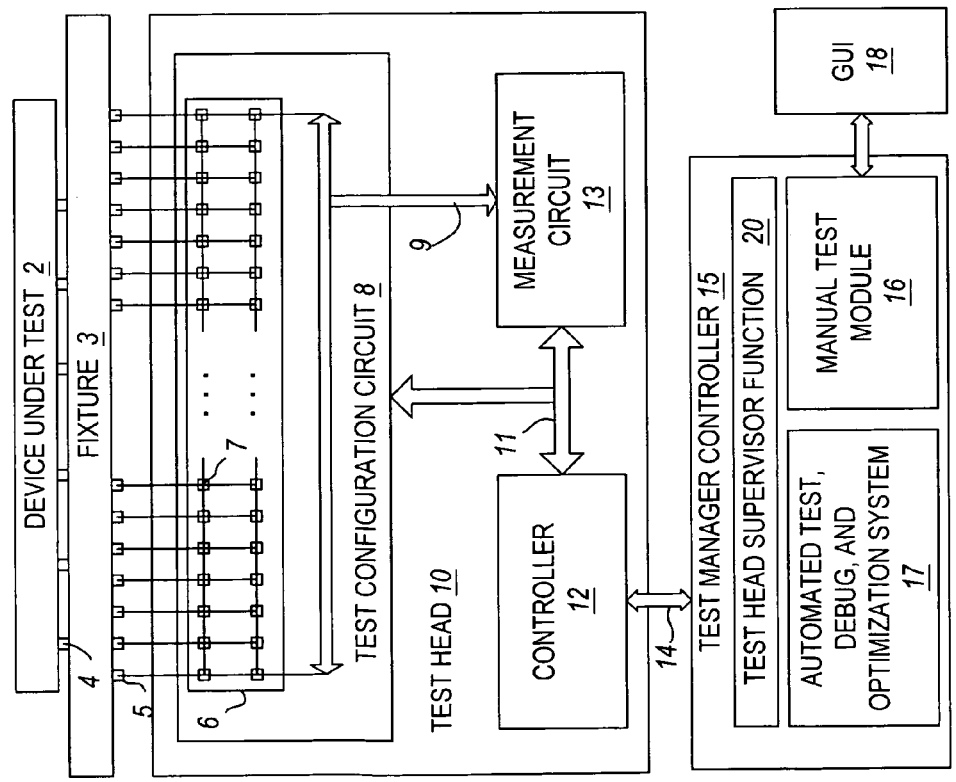
FIG. 1 is a schematic block diagram of an automated test system implemented in accordance with the invention.

Turning now to the invention, FIG. 1 is a schematic block diagram of an automated test system 1 implemented in accordance with the invention. As illustrated, the test system 1 includes a test head 10 and a test manager controller 15. The controller 15 may be integrated with the test head 10 or execute separately from the test head 10, communicating with the test head 10 via a communication link 14 (as shown).

The test head 10 may support a fixture 3 on which a printed circuit board (PCB) containing or implementing a device under test (DUT) 2 is mounted. Fixture 3, for example a bed-of-nails fixture, is customized for each PCB layout and includes a plurality of probes 4 that electrically connect to nodes of the device under test 2 when the device under test 2 is properly seated on the fixture 3. Probes 4 are coupled via the fixture 3 to test head interface pins 5.

The test head 10 may include a test configuration circuit 8 configured with a programmably configurable matrix 6 of relays 7, which may be programmed by a controller 12 over a control bus 11 to open and/or close various ones of the relays 7 in the matrix 6 to achieve any desired connection between the test head interface pins 5 of the test head 10 and a set of measurement busses 9. The test head 10 is configured with one or more measurement circuits 13. The measurement busses 9 are electrically connected to nodes of the measurement circuits 13. The particular nodes of measurement circuits 13 which are connected to the set of measurement busses 9 may be hardwired within the measurement circuit 13, or alternatively, may be configurable via another programmable matrix (not shown) of relays.

Figure 2:
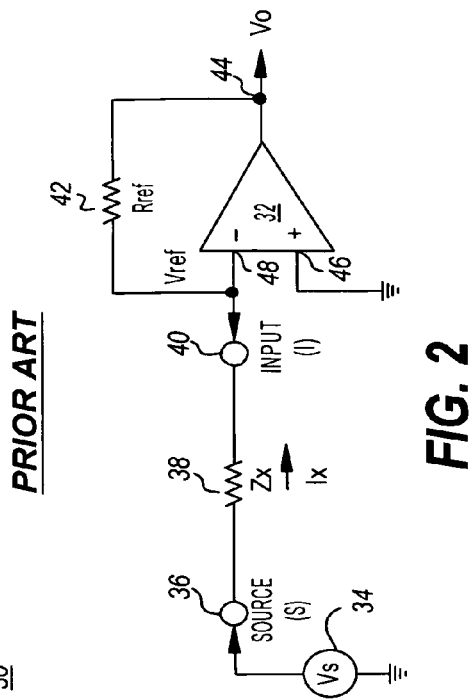
FIG. 2 is a schematic diagram of a prior art measurement circuit.

FIG. 2 illustrates an example instance 30 of a prior art measurement circuit 13. Measurement circuit 30 is known as a "two-wire" measurement circuit. Measurement circuit 30 includes operational amplifier 32 having a positive input terminal 46 coupled to ground and a negative input terminal 48 coupled to an input node I 40. A reference resistor $R_{ref}$ 42 is coupled between output node $V_O$ 44 and input node I 40 of operational amplifier 32. A component under test 38 on the DUT 4 characterized by an unknown impedance $Z_X$ is coupled between input node I 40 and a source input node S 36. The source input node S 36 is stimulated by a known reference voltage $V_S$ that is delivered by a voltage stimulus source 34. Assuming an ideal operational amplifier circuit, the current $I_X$ through the unknown impedance $Z_x$ of the component under test 38 should be equal to the current through reference resistor $R_{ref}$ 42 and a virtual ground should be maintained at negative input terminal 48. As is well-known in the art, in an ideal operational amplifier circuit the theoretical impedance calculation is:

$$Z_x = -R_{ref}(V_S/V_O).$$

The use of a precision DC voltage stimulus source 34 and a DC detector at output node $V_O$ 44 is employed to determine the resistive component of the output voltage when testing resistive analog components such as resistors. The use of a precision AC voltage stimulus source 34 and a phase synchronous detector at output node $V_O$ 44 is employed to determine the reactive components of the output voltage when testing reactive analog components such as capacitors and inductors.

Additional measurements, outside the scope of the present invention, are often taken to reduce guard errors and compensate for lead impedances. In order to take a set of measurements, the connection paths from the component under test 38 on the DUT 2 to the measurement circuit 13 are set up by programming the relay matrix 6 to configure the relays 7 to electrically connect the probes 4 of the fixture 3 that are electrically connected to the nodes on the device under test 2 to the measurement circuit 13 via the internal measurement busses 9. In the example measurement circuit 30 of FIG. 2, the internal measurement busses include an S bus and an/bus which are respectively electrically connected to the source node S 36 and input node I 40. Connections of the internal measurement busses 9 from the device under test 2 to the measurement circuit 13 are programmed at the beginning of the test for the component under test 38, during the test setup. After the connections have been made, the actual test measurements of the component under test 38 may be obtained by the measurement circuit 13 after waiting for the inherent delays of the relay connections to be completed. At the conclusion of the test, the relay connections are all initialized to a known state in preparation for the start of the next test.

The measurement circuit 30 described in FIG. 2 is for purposes of example only. FIG. 2 illustrates example hardware connections, in particular, the measurement circuit 13 of FIG. 1, that must be provided by in-circuit ATE to perform the in-circuit test on a particular device, in this case as device 38 characterized by an unknown impedance $Z_X$. It will be appreciated, however, that a typical in-circuit test will cover many thousands of devices, including resistors, capacitors, diodes, transistors, inductors, etc.

Turning back to FIG. 1, the test manager controller 15 preferably comprises a test head supervisor function 20, a manual test module 16, and automated test debug and optimization system module 17. The test manager controller 15 preferably communicates with the test head controller 12 over a bus 14. Such communication includes instructions to configure the matrix 6 of relays 7, (and other relay matrices, if they exist) to achieve a set of desired connection paths between the device under test 2 and measurement circuits 13, test data, test instructions, and return test results data generated by the test head 10.

The manual test module 16 may receive manually submitted tests for execution on the test head 10. Manually submitted tests may be submitted, for example, via a graphical user interface 18 executing on a computer system. Manually submitted tests may be formulated by a test engineer on-the-fly or may be pre-formulated and downloaded to the test manager controller 15 at the time the test is to be submitted to the test head 10.

The automated test debug and optimization system 17, discussed in detail hereinafter, generates, debugs and/or optimizes in-circuit tests for the DUT 2 executed by the test head 10.

The test head supervisor function 20 manages the submission of tests received from various sources, for example from both the manual test module 16 and the automated test debug and optimization system module 17, to the test head 10 for execution.

Figure 3:
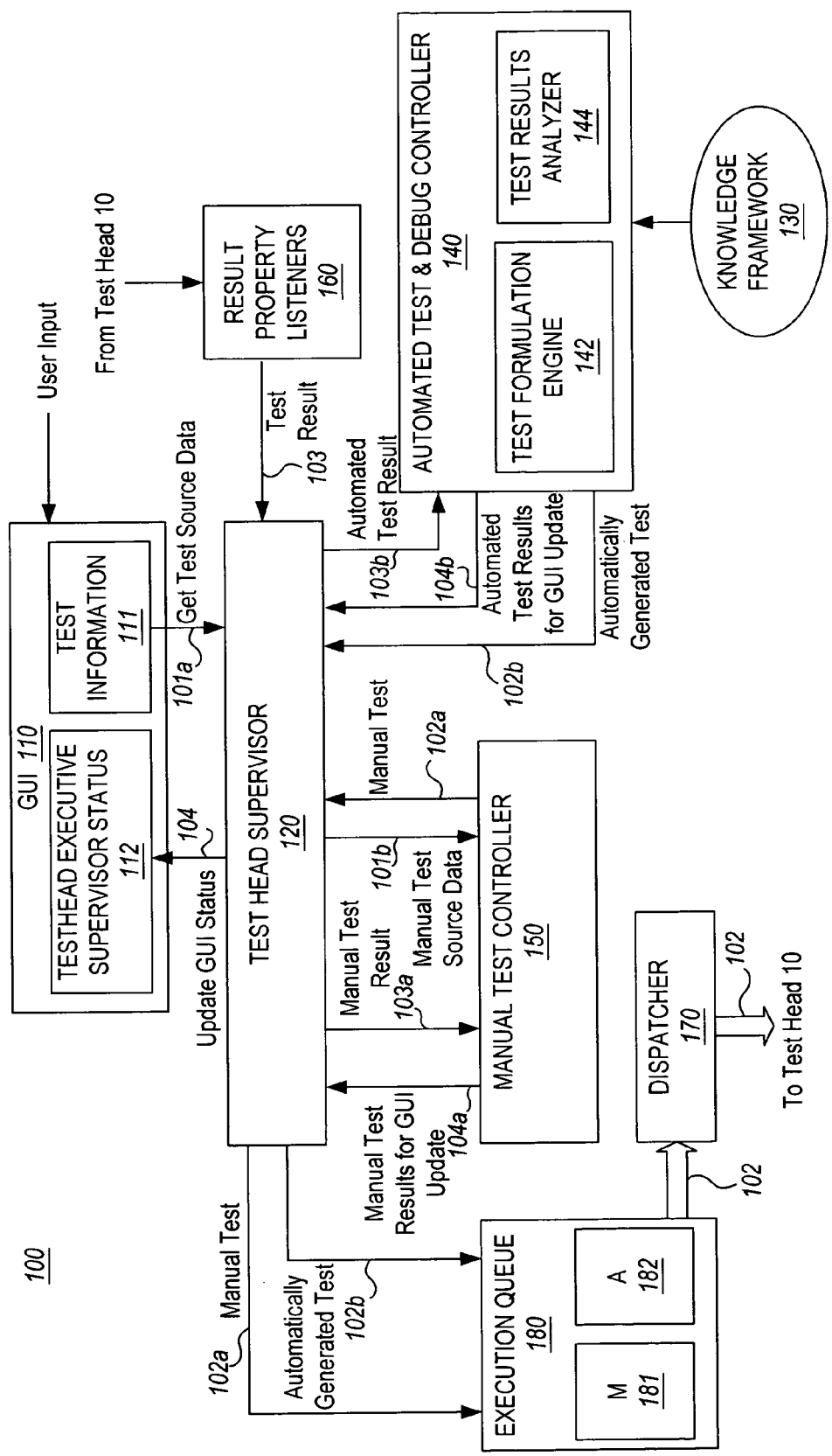
FIG. 3 is a block diagram of the software framework for the automated test system of FIG. 1.

Turning now to FIG. 3, there is shown an exemplary embodiment 100 of the software framework of a test system such as test system 1 in FIG. 1. Generally, the software framework 100 implements executable software code to perform the functionality for the following modules: a Testhead Execution Supervisor 120, a Manual Test Controller 150, and an Automated Test & Debug Controller 140. It is to be understood that the functionality described for each of the modules may be variously embodied, and that the modules may be combined or the functionality of the modules otherwise distributed.

The Testhead Execution Supervisor 120 is the single point of contact (SPOC) that interfaces between the test head controller engine (12 in FIG. 1) and the Manual Test Controller 150 and Automated Test & Debug Controller 140. All requests to use or access the test head 10 are submitted and synchronized through the Testhead Execution Supervisor 120. The Testhead Execution Supervisor 120 receives tests 102a, 102b to be submitted to the test head 10 from multiple sources, namely the Manual Test Controller 150 and Automated test & debug controller 140, and enters them into one or more execution queues 180 for dispatch to the test head 10. The test head 10 executes only one test at a time. A dispatcher function 170 monitors the status of the test head 10 and if the test head 10 is idle, selects a test 102 from the execution queue(s) 180, sends it to the test head 10 for execution, and removes it from the execution queue 180 once execution of the test 102 by the test head 10 is completed.

A graphical user interface (GUI) 110 collects user input from a user and displays test status and other related information. The GUI 110 includes a test information collection function 111 that collects Test Source Data 101a from the user that is sent to through the test head supervisor 120 to the manual test controller 150 (as manual test source data 101b) and used by the manual test controller 150 to formulate a manual test 102a.

The test head supervisor 120 receives manual tests 102a from the manual test controller 150 and causes them to be entered into an execution queue 180, as detailed hereinafter.

When a test 102 is executed on the test head, one or more result property listeners 160 monitor the test head for available test results 103. Test results 103 are forwarded by the result property listeners 160 to the test head supervisor 120 for forwarding on to the appropriate test controller (e.g., the manual test controller 150 if the test result 103a is of a manual test 102a, or the automated test & debug controller 140 if the test result 103b is of an automatically generated test 102b).

The GUI 110 also includes a testhead executive supervisor status function 112 that receives test result status 104 for use in updating the GUI display for presentation to the user.

The automated test & debug controller 140 includes a test formulation engine 142 which generates one or more tests 102b that are ready for execution by the test head 10 during the lifetime of the automated debug controller 140. In automatically generating a test 102b, the test formulation engine 142 accesses a knowledge framework 130 to determine the appropriate actions to take, which may include validation criteria and stability criteria.

In order to better understand the nature of automatic test generation, we first turn to an example format of a test file 102 expected by the test head 10. The test 102 received by the test head 10 will typically be packaged in a data structure that includes the information contained in the source file of the test to be debugged, and also other information such as device name, etc. For example, the test source file 102 for a resistor device family may look like the following:

---
R208.dat
---

```
!!!! 2 0 1 1021582599 0000
! IPG: rev 05.00pd Thu May 16 14:56:40 2002
! Common Lead Resistance 500m, Common Lead Inductance 1.00u
! Fixture: EXPRESS
disconnect all
connect s to "R208-1"; a to "R208-1"
connect i to "R208-2"; b to "R208-2"
resistor 10, 12.8, 3.75, re1, ar100m, sa, sb, en
! "r208" is a limited test.
! DUT: nominal 10, plus tol 1.00 %, minus tol 1.00 %
! DUT: high 10.1, low 9.9
! TEST: high limit 11.276, low limit 9.625
! Tolerance Multiplier 5.00
! Remote Sensing is Allowed
```

Each test 102 tests a single individual component on the DUT 2 mounted on the fixture 3 of the test head 10, and is a representation of the test source file that has been prepared (i.e. compiled into object code and therefore no longer in the ASCII text readable format) to run/execute on a different processor on the test head 10.

Figure 4:
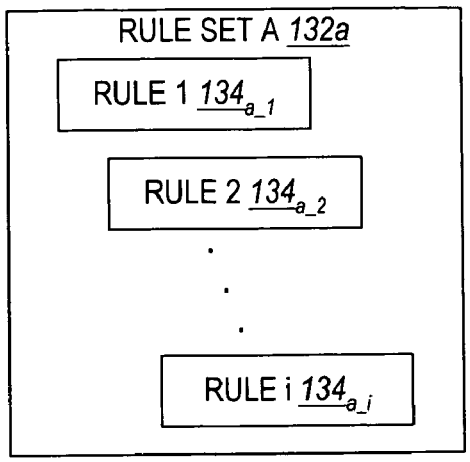
FIG. 4 is a block diagram of a knowledge framework in accordance with the invention.
Figure 4:
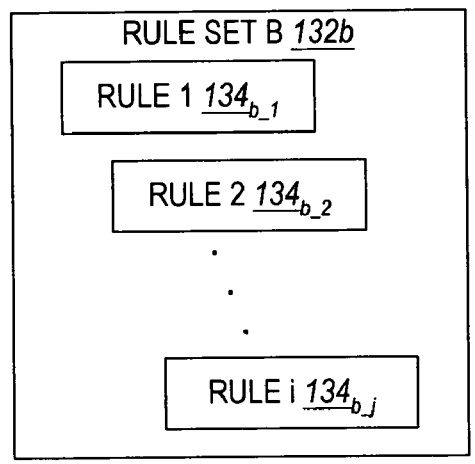
Figure 4:
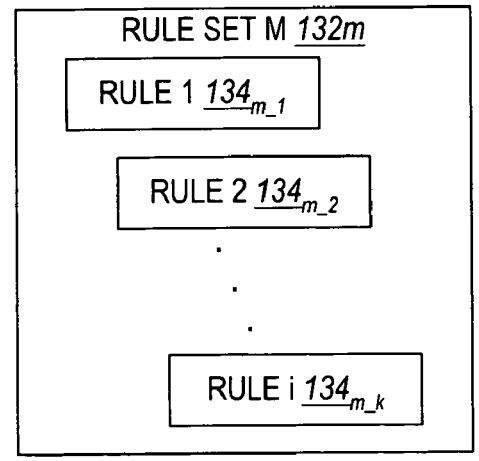
Figure 5:
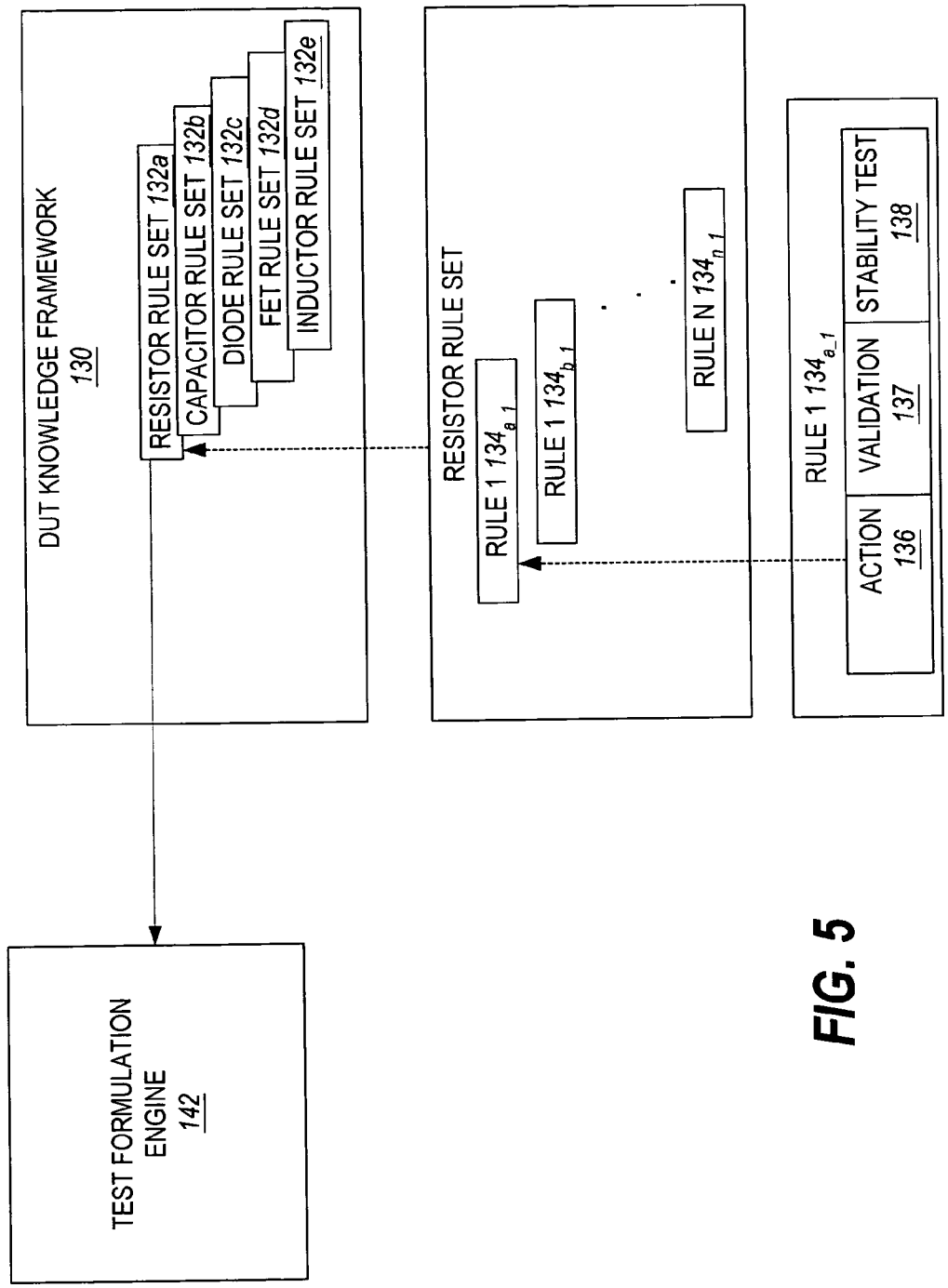
FIG. 5 is a structural diagram of a rule.

Turning back to discussion of the automated test & debug controller 140 and the automatic generation of tests based on the knowledge framework 130, the knowledge framework 130 contains the test knowledge about the various components to be tested on the DUT 2, which allows the automated debug controller 140 to determine how to formulate and package a given test. A more detailed diagram of a preferred embodiment of the knowledge framework 130 is illustrated in FIG. 4. As shown therein, the knowledge framework 130 includes one or more rule sets $132_a$, $132_b$, ..., $132_m$. Each rule set $132_a$, $132_b$, ..., $132_m$, has associated with it one or more rules $134_{a\_1}$, $134_{a\_2}$, ..., $134_{a\_i}$, $134_{b\_1}$, $134_{b\_2}$, ..., $134_{b\_i}$, $134_{m\_1}$, $134_{m\_2}$, ..., $134_{m\_k}$. FIG. 5 illustrates the structure 134 of each rule $134_{a\_1}$, $134_{a\_2}$, ..., $134_{a\_i}$, $134_{b\_1}$, $134_{b\_2}$, ..., $134_{b\_i}$, $134_{m\_1}$, $134_{m\_2}$, ..., $134_{m\_k}$. As shown in FIG. 5, each rule preferably includes three components, including an action component 136, a validation test component 137, and a stability test component 138 (e.g., a process capability index (CPK)).

The action component 136 represents the debugging/optimization strategy. The action component 136 can implement or point to code such as library functions that are to be executed.

The validation test component 137 comprises or points to a test or algorithm that compares an expected result against the actual results measured by the tester. Typically the validation test component 137 will include many expected parameter values to be verified against the received parameter values in order to verify that the automatically generated test 102b passed.

The stability test component 138 is conducted to verify the robustness of a test. During operation, the stability test component 138 is only performed if the validation test passes. Stability test is conducted by applying the validity test a number of times to gather its statistical value (e.g., the process capability index CPK). The CPK is a measurement that indicates the level of stability of the formulated test derived from the knowledge framework 130.

The knowledge framework 130 includes a rule set for every possible component (e.g., resistor, car, diode, FET, inductor, etc.) to be tested on the DUT 2. The automated debug controller 140 operates at an active rule-set level. Each device/component family can have many rule sets, but at any given time, only one rule set in the knowledge framework 130 can be active. The test formulation engine 142 in the automated debug controller 140 executes only the rules in the active rule set for each device/component family.

The set of rules 134 in each rule set 132 are ordered according to a predetermined priority order. The test formulation engine 142 executes the rules within the rule set according to the predetermined priority order. In particular, the test formulation engine 142 generates a list of parameters/measurements that the test head should obtain based on the action component 130 and validation component 137 of the currently selected rule 134 of the active rule set 132. This list of parameters/measurements represents the merits of the test from which the component being tested can be classified as "good" or "bad". Other classifications are possible.

Once the test formulation engine 142 automatically generates a test 102b, the automatically generated test 102b is sent to the test head execution supervisor 120 for insertion into the execution queue 180.

The automated debug controller 140 includes a test results analyzer 144. The test results analyzer 144 processes the test results 103b resulting from execution of the test 102b by the test head 10, compares the actual parameters/measurements to those expected as indicated in the test validation component 137 of the rule 134 from which the test 102b was generated.

If one or more of the actual test parameters does not meet the expected parameters/measurements set forth by the test validation component 137 of the rule 134 from which the test 102b was generated, the test is considered bad and is discarded. If additional unprocessed rules 137 in the active rule set 132 remain to be processed, the test formulation engine 108 then selects the next highest priority rule 134 from the set 132, and generates a new test 102b based on the selected new rule.

The process is repeated until a valid test 102b is found. Once a valid test 102b is found, then the test is re-executed one or more iterations to generate actual stability levels (e.g., CPK) and the results compared to the required stability criteria as set forth in the stability component 137 of the rule 134 from which the test 102b was generated. If the test 102b passes the stability test, it is considered a valid test.

Operation of the automated test & debug controller 140 is described in greater detail in co-pending U.S. application Ser. No. UNKNOWN, to Loh et al., entitled "Method And Apparatus For Automated Debug And Optimization Of In-Circuit Tests", which is hereby incorporated by reference for all that it teaches.

A result property listener function 160 monitors status and data coming back from the test head 10 and packages the status and data into test results 103. The test results 103 comprise the test parameters that are actually measured by the test head 10 during execution of the test. The test results 103 are passed back to the test head execution supervisor 120, indicating that test execution on the test head 10 is complete and that the test head 10 resource is freed up for a new job. The test head execution supervisor 120 forwards the test results 103 to the source (i.e., either the manual test controller 150 or the automated debug controller 140) from which the test was originated. The dispatcher function 170 monitors the status of the test head 10. When the test head 10 becomes idle due to completion of a test, if there are pending tests waiting for dispatch to the test head 10 present in the dispatch queue 180, removes the next highest priority pending test from the queue 180 and allocates the test head 10 resource to execution of the next test.

Turning now to discussion of the execution queue 180, the test head supervisor 120 enters testhead-ready tests 102a, 102b in priority order in the execution queue 180. As the test head resource comes available, the dispatcher function 170 removes the highest priority test from the queue 180, and dispatches it to the test head 10 for execution.

Preferably, a priority scheme is implemented to ensure that manually submitted tests are executed with higher priority than automatically generated tests. For example, a test submitted with a manual identity "M" will have higher execution priority over tests submitted with an automated test identity "A". As described hereinafter, the automated test rule-based framework 130 is made up of multiple automated tests (or "actions" 136), allowing manual tests to intercept in between the automated tests. By deploying the automated test framework 130 as the basis of the overall testing operation, the test head 10 may be made to run continuously, toggling in between the manual tests 102a that are submitted by the test engineer and the system generated automated tests 102b.

Figure 6:
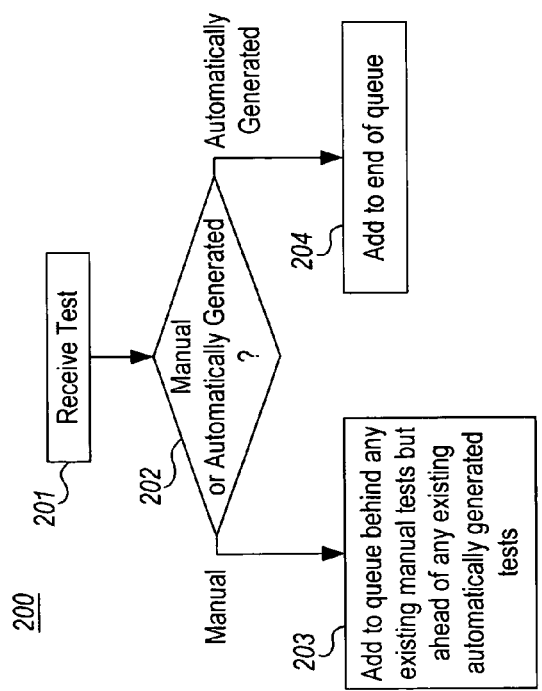
FIG. 6 is a flowchart of an exemplary method for managing an execution queue for tests to be executed on a test system.

FIG. 6 is a flowchart of an exemplary method 200 for managing the test queue 180 for incoming tests 102. This method 200 may be performed by the test head supervisor function 120 or may be integrated into the dispatcher 170 for determining priority of tests in the queue. As illustrated, when a test is received (step 201), a determination is made as to the source of the test—that is, whether it was manually input via the GUI 111, or whether it was automatically generated by the automated test & debug controller 140 (step 202). If the test was manually input, the test is added to the Execution Queue 180 after any pending manually input tests but before any pending automatically generated tests (step 203). If the test was automatically generated to fill idle test head time, the test is added to the end of the execution queue (step 204). Thus, any manually input test is given priority over any automatically generated tests created to fill idle time.

Figure 7:
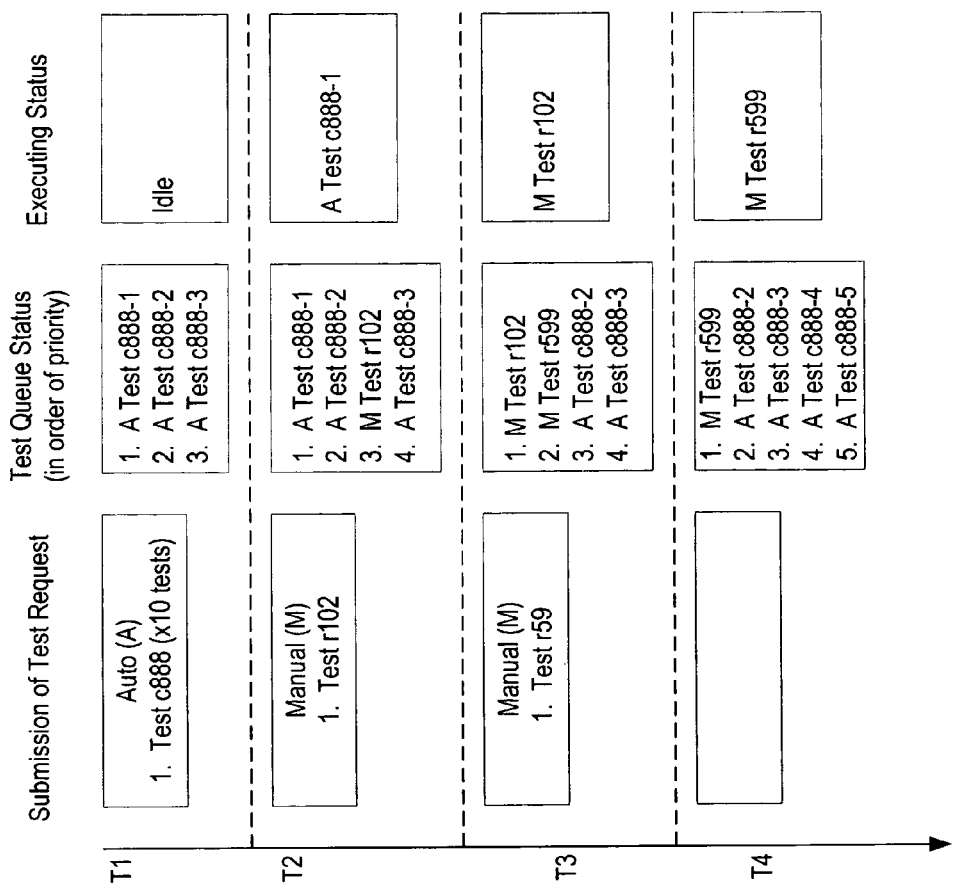
FIG. 7 is a timeline diagram illustrating an example set of test requests and the resulting test queue status for an implementation that gives manual tests higher execution priority over automated tests.

FIG. 7 is a timeline diagram illustrating an example set of test requests and the resulting test queue status and test head execution status for an implementation that gives manual tests higher execution priority over automated tests. As illustrated, at time labeled T1, an automatically generated test c888 that is made up of five automated tests is submitted to the Testhead Execution Supervisor 120. The Testhead Execution Supervisor 120 begins sending the five automatically generated tests, identified as automatically generated by the identifier "A", to the Execution Queue 180. The test head 10 is initially idle, and the dispatcher 170 will send the first test in the queue, A Test c888-1 to the test head 10 for execution.

At time labeled T2, a manual test r102 is submitted to the Testhead Execution Supervisor 120. The Testhead Execution Supervisor 120 interrupts sending of the automated tests to the execution queue 180 to send the higher priority manual test r102 to the queue, identified as a manual test by the identifier "M". Because the manual test r102 is of higher priority than automatically generated tests, the manual test r102 is inserted ahead of any automated tests currently in the queue 180 that are pending but not yet executing. Accordingly, manual test r102 is placed ahead of automated test c888-2 in the queue 180 because automated test c888-2 has not yet been sent to the test head 10 for execution, but is placed after automated test c888-1 because the test head 10 is currently executing test c888-1.

At time labeled T3, the test head has completed execution of test c888-1 and therefore automated test c888-1 is removed from the queue and the highest priority test in the queue, namely manual test r102 is then sent to the test head 10 for execution. Additionally, a manual test r599 is submitted to the Testhead Execution Supervisor 120. The Testhead Execution Supervisor 120 again interrupts sending of the automated tests to the execution queue 180 to send the higher priority manual test r599 to the queue. Again, because the manual test r599 is of higher priority than automatically generated tests, the Testhead Execution Supervisor 120 inserts the manual test r599 ahead of any automated tests currently in the queue 180 that are pending but not yet executing, but after any previously submitted manual tests. Accordingly, manual test r599 is placed after manual test r102, but ahead of automated test c888-3 in the queue 180.

At time T4, the test head has completed execution of test r102 and therefore manual test r102 is removed from the queue and the next highest priority test in the queue, namely manual test r599 is then sent to the test head 10 for execution. The Testhead Execution Supervisor 120 completes sending the remainder of the automatically generated tests to the Execution Queue 180.

After time T4, if no other tests are submitted to the Testhead Execution Supervisor 120, the tests will be executed by the test head in the order of their position in the execution queue 180.

In an alternative preferred embodiment, the Testhead Execution Supervisor 120 maintains two queues—ManualExecutionQueue 181 for submission of high priority manually submitted tests, and AutoExecutionQueue 182 for submission of automatically generated tests. In this embodiment, the dispatch function 170 always empties the ManualExecutionQueue 181 prior to dispatching any test from the AutoExecutionQueue 182. In an alternative preferred embodiment, the dispatch queue 180 comprises at least a high priority queue 181 and a low priority queue 182. The dispatcher function 170 dispatches all tests pending in the high priority queue 181 prior to dispatching any test pending in the low priority queue 182.

Figure 8:
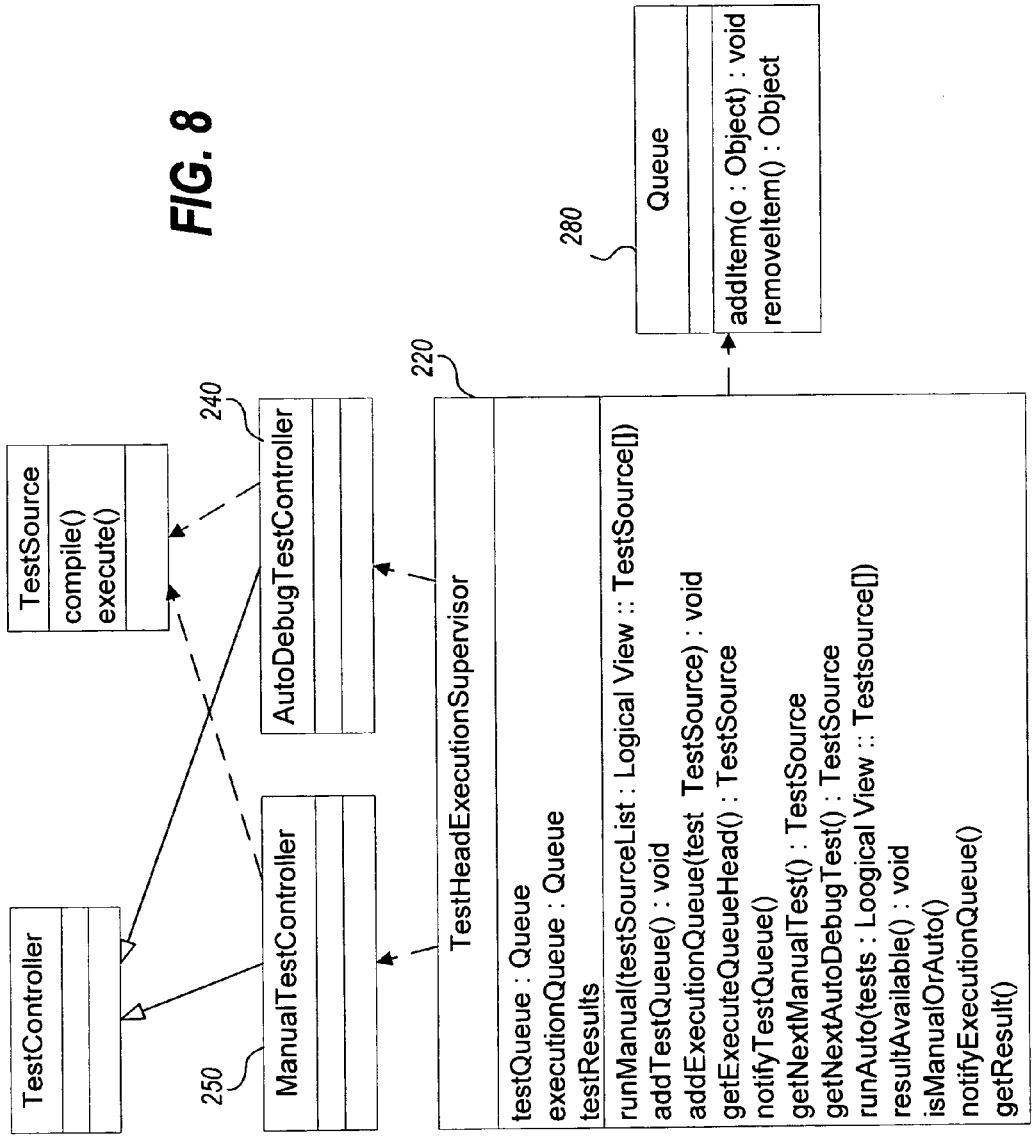
FIG. 8 is a class diagram illustrating a preferred embodiment of an implementation of the software framework of the test system of FIG. 1.

As described in detail above, the test head execution supervisor 120 is essentially an interface between the test head 10 and the manual test controller 150 and automated test & debug controller 140 whose purpose is to protect the test head resource from overloading. In the illustrative embodiment, the test head 10 itself is a single processing resource; accordingly, the test head 10 can execute only a single job in any given time slot. The test head execution supervisor 120 operates to protect the test head by monitoring the allocation of the test head 10 resource. In the preferred embodiment, the test head execution supervisor 120 is implemented as a Java thread, which processes various jobs that are to be sent to the test head 10. FIG. 8 is a class diagram of the Test Manager Controller 15 framework, and includes classes for a TestheadExecutionSupervisor 220 which implements the functionality of the Testhead Execution Supervisor 120 of FIG. 3, a ManualTestController 250 which implements the functionality of the Manual Test Controller 150, an AutomatedDebugTestController 240 which implements the functionality of the Automated Test & Debug Controller 140, and a Queue 280 which implements the functionality of the Execution Queue 180.

As illustrated, the TestheadExecutionSupervisor 220 class preferably implements a testQueue and an executionQueue, and a testResults attribute which holds the current test results being forwarded to the controller object that activated the currently executed test. The TestheadExecutionSupervisor 220 class preferably also implements functions for runManual, addTestQueue, addExecutionQueue, getExecuteQueueHead, notifyTestQueue, getNextManualTest, getNextAutoDebugTest, resultavailable, is ManualOrAuto, and getResult( ).

The ManualTestController 250 compiles any testsource when a user invokes a manual debug option (e.g., the Run Button on the GUI which invokes the runManual function). The ManualTestController 250 populates the ExecutionQueue of the TestheadExecutionSupervisor 220 with TestSource objects to send to TestHead. The ManualTestController 250 is a thread that goes into a wait state when the queue is empty and wakes up when the queue is populated.

The AutomatedDebugTestController 240 composes and complies any testsource when the user invokes the autodebug capability (e.g., the AutoDebug Button in the GUI). The AutomatedDebugTestController 240 populates the ExecutionQueue of the TestheadExecutionSupervisor 220 with TestSource objects to send to TestHead. The AutomatedDebugTestController 240 is a thread that goes into a wait state when the queue is empty and wakes up when the queue is populated.

If multiple execution queues are implemented, for example a separate manual test queue 181 and a separated automated test queue 182, it is necessary to synchronize the queues and ensure that only one queue is running at any given time. The queues are synchronized and brought into a known state in the following cases: when a test is submitted (both manual and auto), when the controller obtains a test, when the controller encounters a compilation error in preparing the test for execution, when there is a loss of a test head resource for whatever reason, when a test has completed execution.

The present invention maximizes the utilization of the test head 10 by applying automated tests during the idle time between manually submitted tests (i.e., after the last completed manual test and before the commencement of the next manual test). Preferably, the automated tests are self-generated test cases that contribute to the overall debugging experience. Thus, otherwise idle test head time is consumed with meaningful work which assists and reduces the workload of the test engineer. More tests are therefore conducted within the same timeframe, and test head resources are fully utilized during the debugging phase.

Figure 9:
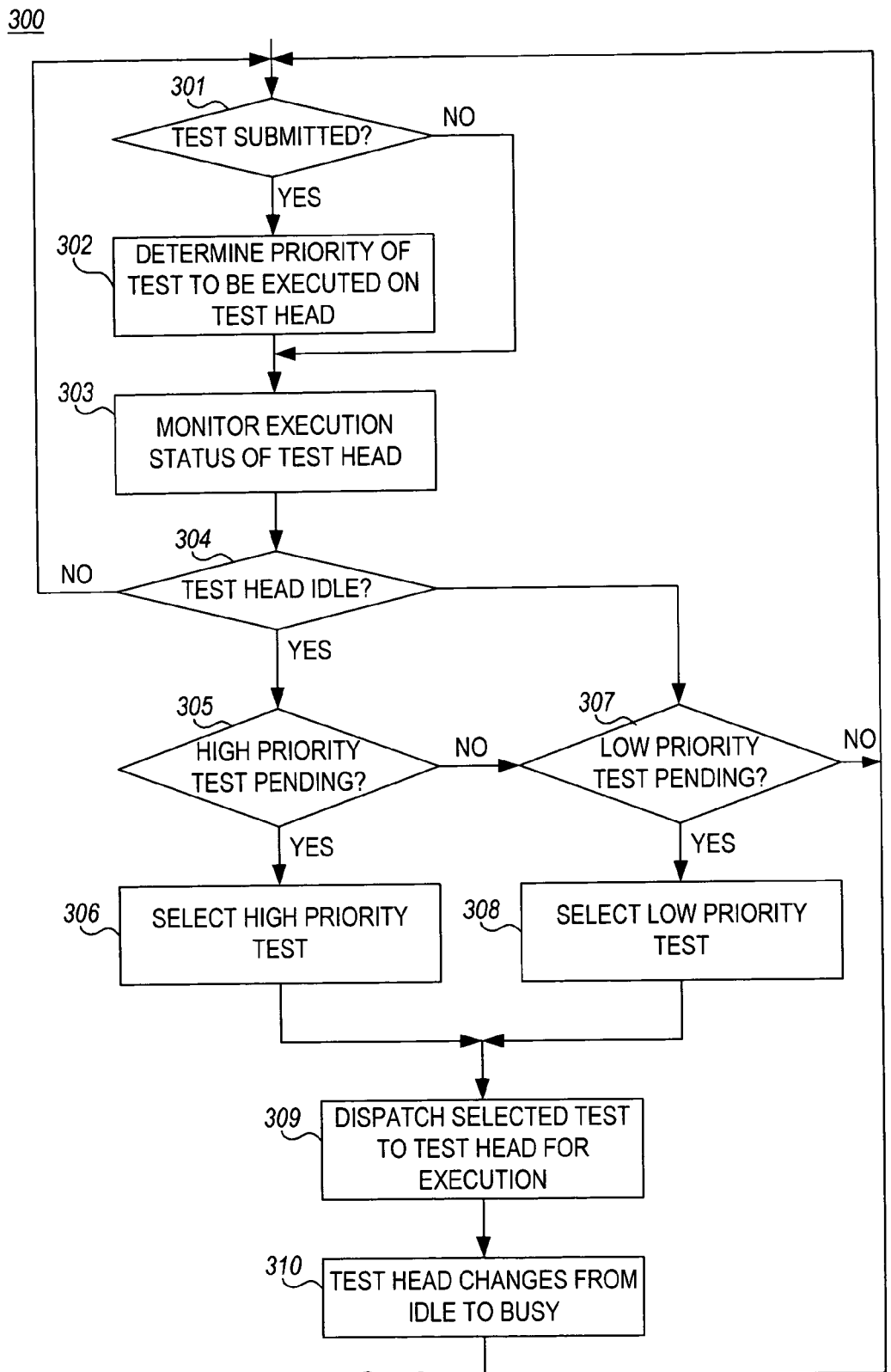
FIG. 9 is a flowchart illustrating an exemplary method of the invention for maximizing utilization of a test head of an automated tester.

FIG. 9 is a flowchart illustrating an exemplary method 300 of the invention for maximizing utilization of a test head of an automated tester. As illustrated, the method 300 generally includes receiving prioritized tests to be executed on the test head (step 301). In the illustrative embodiment, the source from which the tests are received identify the priority of the received test. In this regard, if a test is received from the Manual Test Controller 150, the test is considered a "high" priority test, whereas if the test is received from the Automated Debug Controller 140, the test is considered a "low" priority test. Other priority schemes may be implemented. The execution status of the test head is monitored (step 302). If the test head is in an idle state (determined in step 303), then the priorities of the pending tests are examined. If one or more high priority tests are pending, a high priority test is selected (step 304) and dispatched to the test head for execution (step 305), and the state of the test head changes from "idle" to "busy". If no high priority tests are pending but one or more low priority tests are pending, a low priority test is selected (step 306) and dispatched to the test head for execution (step 307) and the state of the test head changes from "idle" to "busy". The method is repeated, receiving new tests when submitted and monitoring the status of the test head to submit pending tests in order of priority.

In the preferred embodiment, the automatic debug function is enabled to allow the automatic debug controller to automatically generate low priority tests to be executed on the test head.

It will be appreciated that in order to meet realtime requirements of automated industrial testers, the operational methods 200 and 300 FIGS. 6 and 9 respectively are preferably implemented as one or more software routines or applications comprising program instructions tangibly embodied on a storage medium for access and execution by computer hardware. Accordingly, the functional blocks of FIGS. 1 and 3 necessarily comprise hardware and preferably software.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. An automated test system, comprising:

a test head which executes tests on an electrical device; and a test head management controller, the test head management controller comprising:

a test head execution supervisor function that receives tests to be executed on the test head, determines if the received tests are high priority manually submitted tests or low priority automatically generated tests, stores the received tests in an execution queue, monitors an execution status of the test head, and when the test head is in an idle state, determines whether one or more high priority tests are pending in the execution gueue;

if one or more high priority tests are pending, selects a high priority test and dispatches the selected high priority test to the test head for execution;

if one or more high priority tests are not pending, determines whether one or more low priority tests are pending in the execution queue; and if one or more low priority tests are pending, selects a low priority test and dispatches the selected low priority test to the test head for execution.

2. A test system in accordance with claim 1, further comprising:

an automated test generator that automatically generates one or more low priority tests to be executed on the test head.

3. A test system in accordance with claim 1, further comprising:

a graphical user interface that allows a user to manually submit a high priority test.

4. A test system in accordance with claim 1, wherein the execution gueue comprises:

a high priority queue for keeping track of pending high priority tests;

a low priority queue for keeping track of pending low priority tests.

5. A test system in accordance with claim 4, wherein the test head management controller further comprises:

a dispatcher function that dispatches tests to the test head first from the high priority queue, and only when all tests from the high priority queue have been submitted to the test head, then from the low priority queue.

* * * * *

UNITED STATES PATENT AND TRADEMARK OFFICE
CERTIFICATE OF CORRECTION

| | |
|---|---|
| PATENT NO. | : 7,253,606 B2 |
| APPLICATION NO. | : 11/183342 |
| DATED | : August 7, 2007 |
| INVENTOR(S) | : Loh et al. |

It is certified that error appears in the above-identified patent and that said Letters Patent is hereby corrected as shown below:

TITLE page, ITEM (75), under "Inventors", in column 1, line 2, delete "Fort Collins," and insert -- Loveland, --, therefor.

In column 11, line 15, in Claim 1, delete "gueue;" and insert -- queue; --, therefor.

In column 12, line 11, in Claim 4, delete "gueue" and insert -- queue --, therefor.

Signed and Sealed this

Twenty-fifth Day of December, 2007

JON W. DUDAS
*Director of the United States Patent and Trademark Office*